United States Patent
Kim et al.

(10) Patent No.: US 10,504,970 B2
(45) Date of Patent: Dec. 10, 2019

(54) ORGANIC LIGHT EMITTING DIODE DISPLAY WITH COLOR FILTERS HAVING RECESS PORTION OR CONVEX PORTION

(71) Applicant: Samsung Display Co., Ltd., Yongin-si (KR)

(72) Inventors: Min-Woo Kim, Yongin (KR); Jae-Ik Lim, Yongin (KR); Man-Seob Choi, Yongin (KR); Won-Gyun Kim, Yongin (KR); Won-Sang Park, Yongin (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/825,750

(22) Filed: Nov. 29, 2017

(65) Prior Publication Data

US 2018/0083071 A1 Mar. 22, 2018

Related U.S. Application Data

(62) Division of application No. 14/011,199, filed on Aug. 27, 2013, now Pat. No. 9,859,342.

(30) Foreign Application Priority Data

Apr. 30, 2013 (KR) .......... 10-2013-0048689

(51) Int. Cl.
*H01L 27/32* (2006.01)
*H01L 51/52* (2006.01)
*H01L 51/50* (2006.01)

(52) U.S. Cl.
CPC ........ *H01L 27/322* (2013.01); *H01L 51/5012* (2013.01); *H01L 51/5036* (2013.01);
(Continued)

(58) Field of Classification Search
CPC  H01L 27/322; H01L 51/5262; H01L 51/5275
(Continued)

(56) References Cited

U.S. PATENT DOCUMENTS

2005/0146658 A1   7/2005   Kim et al.
2007/0054436 A1*  3/2007   Hirakata ............... G02B 5/201
                                                          438/69
(Continued)

FOREIGN PATENT DOCUMENTS

CN       1637563 A      7/2005
CN       1694594        11/2005
(Continued)

*Primary Examiner* — Robert T Huber
(74) *Attorney, Agent, or Firm* — Cantor Colburn LLP (57) ABSTRACT

An organic light emitting diode display that maintains a luminance distribution characteristic of each pixel at the side substantially similar to a luminance distribution characteristic of each pixel at the front of the OLED display by improving a twist of a lateral color with respect to a front color. The organic light emitting diode display includes a substrate, a driving wire disposed on the substrate, a color filter disposed on the driving wire. The color filter includes a blue color filter, a red color filter, and a green color filter formed on the driving wire; and an organic light emitting diode disposed on the color filter, where a recess portion is defined at a lower surface of the blue color filter, and a convex portion is defined at a lower surface of the red color filter or the green color filter.

11 Claims, 4 Drawing Sheets

(52) U.S. Cl.
CPC ...... *H01L 51/5262* (2013.01); *H01L 51/5271* (2013.01); *H01L 51/5275* (2013.01); *H01L 27/3246* (2013.01); *H01L 51/525* (2013.01)

(58) Field of Classification Search
USPC .............................. 257/40, 89, 98, E33.068
See application file for complete search history.

(56) References Cited

U.S. PATENT DOCUMENTS

| | | |
|---|---|---|
| 2007/0090350 A1* | 4/2007 | Lee ................... H01L 27/322 257/40 |
| 2009/0072730 A1 | 3/2009 | Choi et al. |
| 2009/0200544 A1* | 8/2009 | Lee ................... H01L 51/5215 257/40 |
| 2009/0295283 A1 | 12/2009 | Kim et al. |
| 2010/0053044 A1 | 3/2010 | Lee et al. |
| 2010/0156279 A1 | 6/2010 | Tamura et al. |
| 2011/0127500 A1 | 6/2011 | Ko et al. |

FOREIGN PATENT DOCUMENTS

| | | |
|---|---|---|
| CN | 1768321 A | 5/2006 |
| CN | 102985855 A | 3/2013 |
| JP | 2000187231 | 7/2000 |
| JP | 2006058710 A | 3/2006 |
| JP | 2006127985 A | 5/2006 |
| JP | 2009259573 | 11/2009 |
| JP | 2010287421 | 12/2010 |
| KR | 100579549 | 5/2006 |
| KR | 1020060052335 A | 5/2006 |
| KR | 100703158 | 4/2007 |
| KR | 1020070037356 A | 4/2007 |
| TW | I546952 | 8/2016 |

* cited by examiner

ORGANIC LIGHT EMITTING DIODE DISPLAY WITH COLOR FILTERS HAVING RECESS PORTION OR CONVEX PORTION

This application is a divisional of U.S. patent application Ser. No. 14/011,199, filed on Aug. 27, 2013, which claims priority to Korean Patent Application No. 10-2013-0048689 filed on Apr. 30, 2013, and all the benefits accruing therefrom under 35 U.S.C. § 119, the content of which in its entirety is herein incorporated by reference.

BACKGROUND

1. Field

The described technology generally relates to an organic light emitting diode ("OLED") display.

2. Description of the Related Art

An organic light emitting diode ("OLED") display includes a plurality of OLEDs formed of a hole injection electrode, an organic emission layer, and an electron injection electrode. Each OLED emits light by energy generated when excitons generated as electrons and holes are combined drop from an excited state to a ground state, and the OLED display displays an image by using the light. Accordingly, the OLED display has self-luminance characteristics, and unlike a liquid crystal display ("LCD"), the thickness and weight thereof can be reduced since a separate light source is not required. Further, because the OLED display has high quality characteristics such as low power consumption, high luminance, and high reaction speed, the OLED display is appropriate for use in a mobile electronic device.

The OLED display includes a red organic emission layer emitting red light, a green organic emission layer emitting green light, and a blue organic emission layer emitting blue light, thereby realizing a color. A red color filter, a green color filter, and a blue color filter are formed in a white organic emission layer emitting white light to realize the red, the green, and the blue, or a color filter is not partially formed in the pixel to realize the red, the green, the blue, and the white, thereby forming a white OLED display with improved luminance.

However, when using the white organic emission layer, a white light source emitted from the white organic emission layer of a single layer passes through the color filter formed in each pixel to realize the color such that it is difficult to optimize the color for each pixel. Accordingly, the color characteristic is controlled to be adjusted for one pixel of the red pixel, the green pixel, and the blue pixel such that a lateral characteristic with regard to the front may be changed for each pixel. Accordingly, a difference between the front color and the lateral color is generated thereby a display quality may be deteriorated.

SUMMARY

Exemplary embodiments of the invention provide an organic light emitting diode ("OLED") display that maintains a luminance distribution characteristic of each pixel at the side substantially similar to a luminance distribution characteristic of each pixel at the front of the OLED display by improving a twist of a lateral color with respect to a front color.

An exemplary embodiment of an OLED display includes: a substrate; a driving wire disposed on the substrate; a color filter disposed on the driving wire, where the color filter includes a blue color filter, a red color filter and a green color filter; and an OLED disposed on the color filter, where a width of the blue color filter is greater than a width of the red color filter or the green color filter.

In an exemplary embodiment, the OLED display may further include a cover layer disposed on the color filter and which covers the color filter.

In an exemplary embodiment, the OLED may include an anode disposed on the cover layer, an organic light emitting member disposed on the anode, and a cathode disposed on the organic light emitting member.

In an exemplary embodiment, the OLED display may further include a reflection forming layer disposed on the cover layer and which covers an edge of the anode, and a pixel definition layer disposed on the cover layer and between adjacent color filters of the blue color filter, the red color filter and the green color filter.

In an exemplary embodiment, the blue color filter may extend to a position corresponding to the pixel definition layer, and the green color filter or the red color filter may extend to a position corresponding to the reflection forming layer.

In an exemplary embodiment, the driving wire may include a switching thin film transistor and a driving thin film transistor.

In an exemplary embodiment, the reflection forming layer and the pixel definition layer may include substantially the same material as each other.

In an exemplary embodiment, the reflection forming layer and the pixel definition layer may be separated from each other.

An alternative exemplary embodiment of an OLED display includes: a substrate; a driving wire disposed on the substrate; a color filter disposed on the driving wire, where the color filter includes a blue color filter, a red color filter, and a green color filter; OLED disposed on the color filter, and a light path control layer disposed between the driving wire and the color filter, where a recess portion (i.e., concave portion) is defined at an upper surface of the light path control layer aligned with the blue color filter and a convex portion is defined at an upper surface of the light path control layer aligned with the red color filter or the green color filter.

In an exemplary embodiment, the OLED display may further include a light path control layer disposed between the driving wire and the color filter.

In an exemplary embodiment, the OLED display may further include a cover layer disposed on the color filter and which covers the color filter.

In an exemplary embodiment, the OLED may include an anode disposed on the cover layer, an organic light emitting member disposed on the anode, and a cathode disposed on the organic light emitting member.

In an exemplary embodiment, the OLED display may further include a reflection forming layer disposed on the cover layer and which covers the edge of the anode, and a pixel definition layer disposed on the cover layer and between adjacent color filters of the blue color filter, the red color filter and the green color filter.

In an exemplary embodiment, the driving wire may include a switching thin film transistor and a driving thin film transistor.

In an exemplary embodiment, the reflection forming layer and the pixel definition layer may include substantially the same material as each other.

In an exemplary embodiment, the reflection forming layer and the pixel definition layer may be separated from each other.

In exemplary embodiments of OLED display, where the width of the blue color filter is greater than the width of the red color filter or the green color filter, the light path passing through the blue pixel is different from the light path passing through the red pixel or the green pixel such that the twist of the side color with regard to the front color may be improved.

In exemplary embodiments of OLED display, where the recess portion (i.e., concave portion) is defined in the light path control layer at a lower surface of the blue color filter and the convex portion is defined in the light path control layer at a lower surface of the green color filter or the red color filter, the light path of the side of the blue pixel is substantially the same as the light path of the front and the light path of the side of the green pixel or the red pixel is longer than the light path of the front such that the luminance of the side in the blue may be improved, and the luminance of the side in the green pixel or the red pixel may be substantially maintained or reduced.

Accordingly, in such embodiments, the color twist defect of the side caused by the side luminance reduction in the blue pixel, which may occur in a conventional white organic light emitting diode display, is substantially improved.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION OF THE EMBODIMENTS

The invention will be described more fully hereinafter with reference to the accompanying drawings, in which exemplary embodiment are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like to reference numerals refer to like elements throughout.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular to embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is to intended merely to better illustrate the invention and does not pose a limitation on the scope of the invention unless otherwise claimed. No language in the specification should be construed as indicating any non-claimed element as essential to the practice of the invention as used herein.

In addition, in the accompanying drawings, a two transistors-one capacitor ("2Tr-1Cap") structured active matrix ("AM") type organic light emitting diode ("OLED") display in which a pixel includes two thin film transistors ("TFT") and one capacitor is illustrated. However, the present disclosure is not limited thereto. Therefore, an OLED display may have various structures in which a pixel may include a plurality of TFTs and a capacitor, a wiring line may be further provided, e.g., formed, and a conventional wiring line may be omitted. Here, a pixel may refer to a minimum unit that displays an image, and an OLED display displays an image through a plurality of pixels.

Hereinafter, exemplary embodiments of the invention will be described in further detail with reference to the accompanying drawings.

An exemplary embodiment of an OLED display will now be described in detail with reference to FIG. 1 to FIG. 3.

Figure 1:
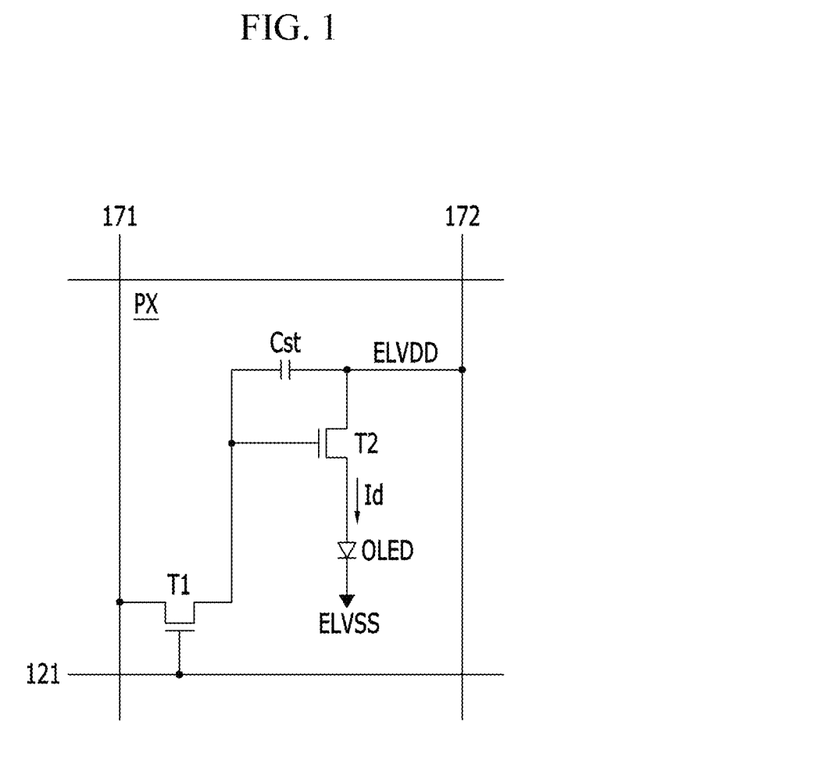
FIG. 1 is an equivalent circuit diagram showing a pixel of an exemplary embodiment of an organic light emitting diode ("OLED") display.

FIG. 1 is an equivalent circuit diagram showing a pixel of an exemplary embodiment of an OLED display. As shown in FIG. 1, an exemplary embodiment of the OLED display includes a plurality of signal lines 121, 171 and 172 and a plurality of pixels PX, which is connected to the signal lines 121, 171 and 172 and arranged substantially in a matrix form including a plurality of pixel columns and a plurality of pixel rows.

In such an embodiment, the signal lines include a plurality of scan lines 121 for transmitting scan signals (or gate signals), a plurality of data lines 171 for transmitting data signals, and a plurality of driving voltage lines 172 for transmitting a driving voltage ELVDD. In such an embodiment, the scan lines 121 extend substantially parallel to each other in a row direction, and the data lines 171 and the driving voltage lines 172 run parallel with each other in a pixel column direction.

In such an embodiment, each of the pixels PX includes a switching thin to film transistor T1, a driving thin film transistor T2, a storage capacitor Cst, and an OLED.

The switching thin film transistor T1 includes a control terminal, an input terminal, and an output terminal. The control terminal of the switching thin film transistor T1 may be connected to the scan line 121, the input terminal of the switching thin film transistor T1 may be connected to the data line 171, and the output terminal of the switching thin film transistor T1 may be connected to the driving thin film transistor T2. The switching thin film transistor T1 transmits a data signal applied to a corresponding data line 171, which is connected thereto, to the driving thin film transistor T2 in response to a scan signal applied to a corresponding scan line 121, which is connected thereto.

The driving thin film transistor T2 includes a control terminal, an input terminal, and an output terminal. The control terminal of the driving thin film transistor T2 may be connected to the switching thin film transistor T1, the input terminal of the driving thin film transistor T2 may be connected to the driving voltage line 172, and the output terminal of the driving thin film transistor T2 may be connected to the organic light emitting diode OLED. The driving thin film transistor T2 allows an output current Id to flow, which varies in amplitude based on a voltage applied between the control terminal and the output terminal.

In an exemplary embodiment, the storage capacitor Cst may be connected between the control terminal and input terminal of the driving thin film transistor T2. The storage capacitor Cst charges when a data signal is applied to the control terminal of the driving thin film transistor T2, and the storage capacitor maintains a voltage level based on the data signal after the switching thin film transistor T1 is turned off.

The OLED includes an anode connected to the output terminal of the driving thin film transistor T2, a cathode connected to a common voltage ELVSS, and an organic light emitting member disposed between the anode and the cathode. The OLED displays an image by emitting light with intensity determined based on an output current Id of the driving thin film transistor T2.

The switching thin film transistor T1 and the driving thin film transistor T2 to may be n-channel field effect transistors ("FET"s) or p-channel FETs. In FIG. 1, a connection relationship among the thin film transistors T1 and T2, the storage capacitor Cst, and the OLED is shown, but not being limited thereto. In an alternative exemplary embodiment, the connection relationship among the thin film transistors T1 and T2, the storage capacitor Cst, and the OLED may be variously modified.

A pixel of the organic light emitting diode display of FIG. 1 will now be described in greater detail with reference to FIGS. 2 and 3.

Figure 2:
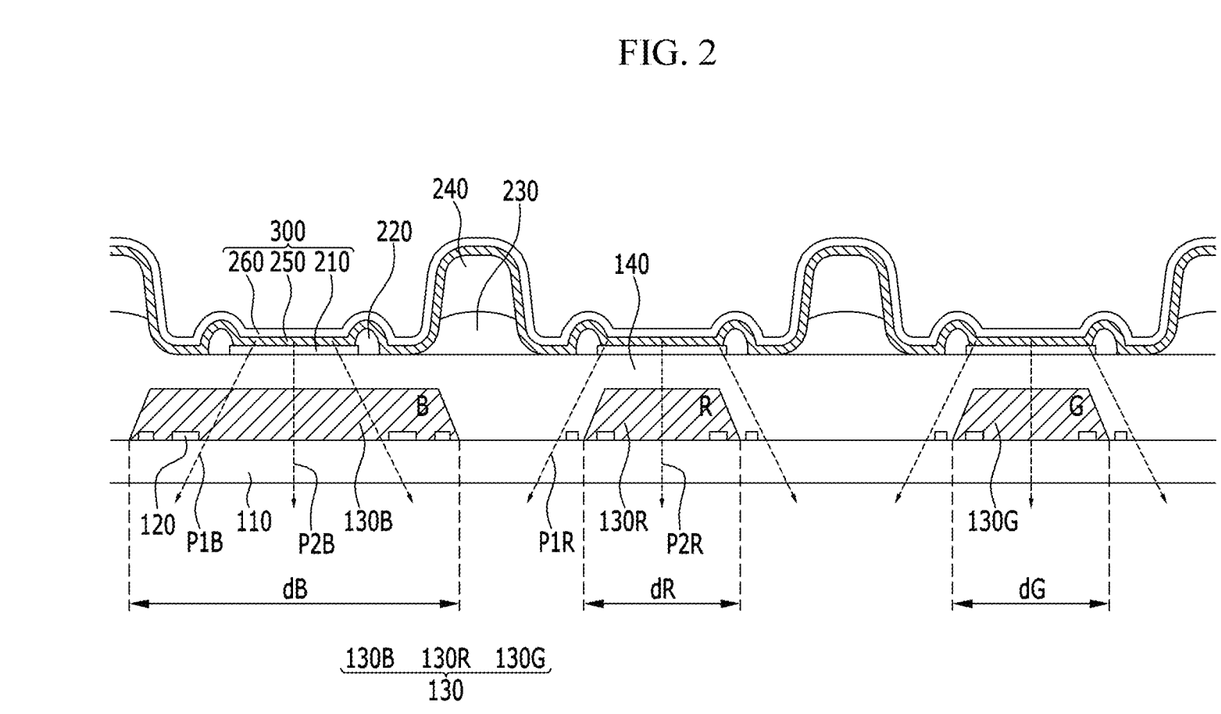
FIG. 2 is a cross-sectional view of an organic light emitting diode ("OLED") display shown in FIG. 1.
Figure 3:
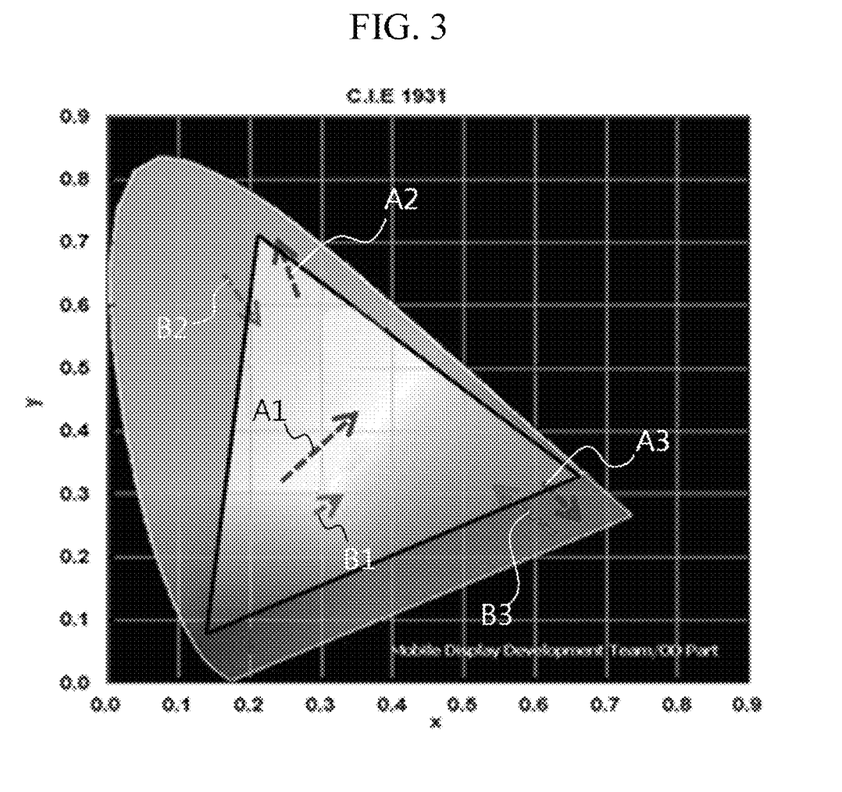
FIG. 3 is a view of a CIE 1931 colorimetric system of an exemplary embodiment of an OLED display and a CIE 1931 colorimetric system of a conventional OLED display.

FIG. 2 is a cross-sectional view of an exemplary embodiment of an OLED display shown in FIG. 1, and FIG. 3 is a view of a CIE 1931 colorimetric system of an exemplary embodiment of an OLED display and a CIE 1931 colorimetric system of a conventional OLED display.

As shown in FIG. 2 and FIG. 3, an exemplary embodiment of an OLED includes a substrate 110, which may include a material such as a transparent glass or plastic, for example, and further include a driving wire 120 including a plurality of signal lines, a plurality of switching thin film transistors and a plurality of driving thin film transistors, which are disposed on the substrate 110. In such an embodiment, the OLED may further include a plurality of thin films on or covering the driving wire 120, such that the driving wire 120 is effectively insulated. In such an embodiment, the driving wire 120 may be disposed in each of a plurality of color pixels, e.g., a blue pixel, a red pixel, and a green pixel.

In an exemplary embodiment, a color filter 130 to realize a color of an image is disposed on the driving wire 120. The color filter 130 includes a blue color filter 130B disposed in the blue pixel, a red color filter 130R disposed in the red pixel, and a green color filter 130G disposed in the green pixel. In an exemplary embodiment, a width dB of the blue color filter 130B is greater than a width dR of the red color filter 130R or a width dG of the green color filter 130G.

In such an embodiment, a cover layer 140, which covers and protects the color filter 130, may be disposed on the color filter 130.

In such an embodiment, an anode 210, which receives a signal transmitted from the driving wire 120, is disposed on the cover layer 140. The to anode 210 may include a transparent conductive oxide such as indium tin oxide ("ITO") and indium zinc oxide ("IZO"), for example, to allow light to be transmitted therethrough, e.g., to allow the light to passing therethrough without substantial intensity loss.

In such an embodiment, a reflection forming layer 220, which covers an edge of the anode 210, and a pixel definition layer 230, which is separated or spaced apart from the reflection forming layer 220, are disposed on the cover layer 140. The reflection forming layer 220 and the pixel definition layer 230 may include substantially the same material as each other, and the pixel definition layer 230 may be disposed between adjacent color filters 130. In an exemplary embodiment, the blue color filter 130B extends to a position corresponding to the pixel definition layer 230, and the green color filter 130G or the red color filter 130R extends to a position corresponding to the reflection forming layer 220.

In such an embodiment, an organic light emitting member 250 is disposed on the anode 210, and a cathode 260 is disposed on the organic light emitting member 250, the reflection forming layer 220 and the pixel definition layer 230.

In an exemplary embodiment, an OLED 300 is defined by the anode 210, the organic light emitting member 250 and the cathode 260.

In an exemplary embodiment, the organic light emitting member 250 may include a white organic emission layer (e.g., a white light emitting organic layer). In such an embodiment, the organic light emitting member 250 may include a single organic emission layer, or may a plurality of organic emission layers, which are laminated to emit light having the white color.

In one exemplary embodiment, for example, the organic light emitting member 250 may include a yellow organic emission layer and a blue organic emission layer, which are combined to emit light having the white color, the organic light emitting member 250 may include a cyan organic emission layer and a red organic emission layer, which are combined to emit light having the white color, or the organic light emitting member 250 may include a magenta to organic emission layer and a green organic emission layer, which are combined to emit light having the white color.

In an exemplary embodiment, the organic light emitting member 250 may further include a plurality of organic layers (not shown) to efficiently transmit the carrier of the holes or electrons to the emission layer as well as the organic emission layer, in which the light emitting is generated. In such an embodiment, the organic layers may include a hole injection layer ("NIL") and a hole transport layer ("HTL"), which are disposed between the anode 210 and the organic emission layer, and an electron injection layer ("EL") and an electron transport layer ("ETL"), which are disposed between the cathode 260 and the organic emission layer.

In an exemplary embodiment, the cathode 260 may include a metal having high reflectance, such as Ag, Al, or alloys thereof, for example.

In an exemplary embodiment, the reflection forming layer 220 and the pixel definition layer 230 are separated (e.g., spaced apart) from each other, and the cathode 260 of the reflection electrode may obliquely extend along the side of the reflection forming layer 220. Accordingly, in such an embodiment, the light emitted from the organic light emitting member 250 and progressing to the side of the organic light emitting member 250 is reflected by the cathode 260 disposed at the side of the reflection forming layer 220 toward the front such that light leakage is effectively prevented.

In an exemplary embodiment, a spacer 240, which maintains an interval between the cover layer 140 and an encapsulation substrate (not shown) that seals the OLED 300, is disposed on the pixel definition layer 230.

In an exemplary embodiment, the blue color filter 130B extends to the position corresponding to the pixel definition layer 230, and the green color filter 130G (e.g., extends to overlap the pixel definition layer 230 when viewed from a top view) or the red color filter 130R extends to the position corresponding to the reflection forming layer 220 (e.g., extends to overlap the reflection forming layer 220 when viewed from a top view) such that a light path P1B of the white light progressing in the side, e.g., obliquely with respect to the substrate 110 (e.g., a to light path of the with light emitted from a side portion of the OLED 300 in an oblique direction) passes through the blue color filter 130B, similarly to a light path P2B of the white light emitted from the organic light emitting member 250 of the blue pixel B and progressing in the front, e.g., substantially perpendicular to the substrate 110. In such an embodiment, differently from the light path of the white light emitted from the organic light emitting member 250 of the green pixel or the red pixel and progressing in the front, e.g., substantially perpendicular to the substrate 110, the light path P1B of the white light progressing in the side, e.g., obliquely with respect to the substrate 110, may not pass through the green color filter 130G or the red color filter 130R, as shown in FIG. 2. Accordingly, in such an embodiment, the white light that does not pass through the green color filter 130G and the red color filter 130R is added at a side of the green pixel and the red pixel, such that chromaticity deteriorated, e.g., reduced.

As shown in FIG. 3, a colorimetric system of the conventional OLED display viewed at a side (e.g., a colorimetric system of the conventional OLED display when observed at a side thereof) is moved into A1, A2, and A3 in each pixel with respect to a colorimetric system of the conventional OLED display viewed at a front such that a substantially change of the color may occur. In an exemplary embodiment, the colorimetric system of the OLED display at the side is moved into B1, B2, and B3 in each pixel and the colorimetric system and thereby converged to a white coordinate. As described above, the light path passing through the blue pixel is to a side of the OLED display to be different from the light path passing through the red pixel or the green pixel to a side of the OLED display such that a twist of the side color with respect to the front color may be improved.

In an exemplary embodiment, as shown in FIG. 2, the width dB of the blue color filter is greater than the width dR of the red color filter or the width dG of the green color filter to improve the twist of the color in the side. In an alternative exemplary embodiment, as shown in FIG. 4, a recess portion (i.e., concave portion) may be provided at an upper surface of the light path control layer 40 aligned with the blue color filter 130B and a convex portion may be provided at an upper surface of the light path control layer 40 aligned with green color filter 130G or the red color filter 130R to improve the twist of the color.

Figure 4:
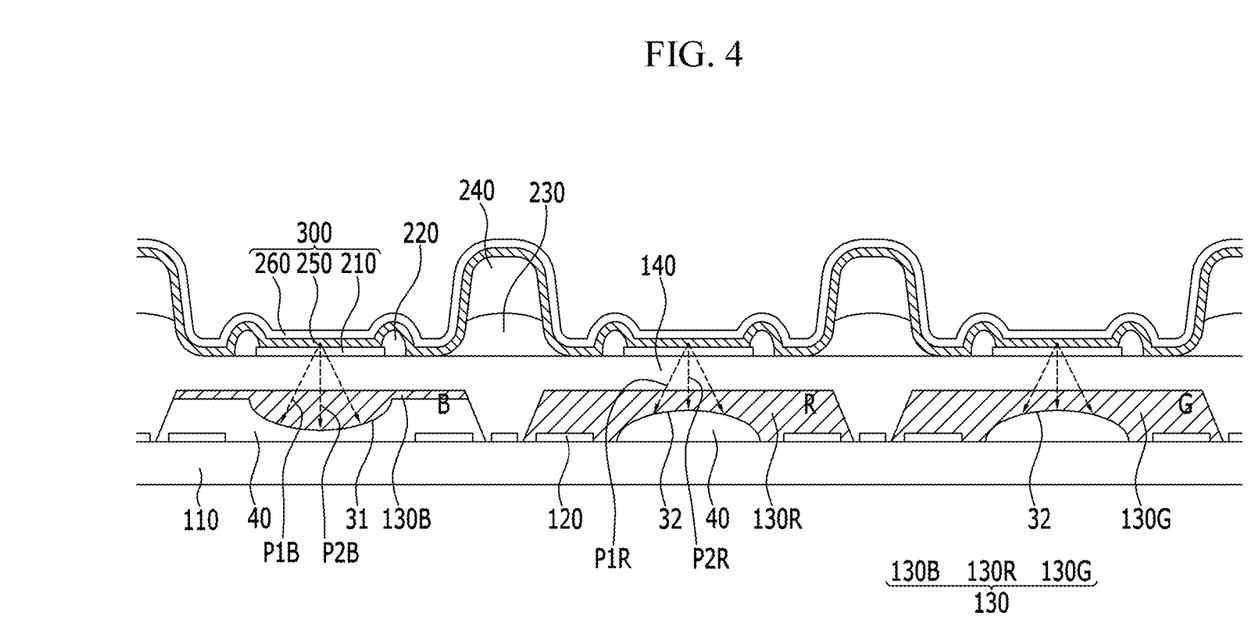
FIG. 4 is a cross-sectional view of an alternative exemplary embodiment of an organic light emitting diode (OLED) display.

FIG. 4 is a cross-sectional view of an alternative exemplary embodiment of an OLED display.

The exemplary embodiment of the OLED display shown in FIG. 4 is substantially to the same as the exemplary embodiment shown in FIG. 2 except for a recess portion at the lower surface of the blue color filter and a convex portion at the lower surface of the green color filter or the red color filter. The same or like elements shown in FIG. 4 have been labeled with the same reference characters as used above to describe the exemplary embodiments of the OLED display shown in FIG. 2, and any repetitive detailed description thereof will hereinafter be omitted or simplified.

As shown in FIG. 4, in an exemplary embodiment, each pixel of the OLED display may include a light path control layer 40 disposed on the driving wire 120, and adjacent light path control layer 40 may be disposed separated or spaced apart from each other.

In such an embodiment, a color filter 130 to realize the color is disposed on the light path control layer 40. The color filter 130 includes the blue color filter 130B formed at the blue pixel, the red color filter 130R formed at the red pixel, and the green color filter 130G formed at the green pixel.

The recess portion 31 is defined (e.g., formed) in the light path control layer 40 at the lower surface of the blue color filter 130B, and the convex portion 32 is defined (e.g., formed) in the light path control layer 40 at the lower surface of the red color filter 130R or the green color filter 130G. In an exemplary embodiment, as shown in FIG. 4, the color filter 130 may include a recess portion (i.e., concave portion) or a convex portion, which corresponds to the convex portion 32 or the recess portion 31, respectively, of the light path control layer 40. In such an embodiment, the thickness of the light path control layer 40 at the blue color filter 130B is reduced by the recess portion 31 of the light path control layer, and the thickness of the light path control layer 40 at the red color filter 130R or the green color filter 130G is increased by the convex portion 32 of the light path control layer 40.

In such an embodiment, the cover layer 140, which covers and protects to the color filter 130, is disposed on the color filter 130.

The anode 210, which receives the signal transmitted from the driving wire 120, is disposed on the cover layer 140. The anode 210 may include a transparent conductive material such as ITO and IZO, for example, to allow light to be transmitted therethrough.

The reflection forming layer 220, which covers an edge of the anode 210, and the pixel definition layer 230, which is separated or spaced apart from the reflection forming layer 220, are disposed on the cover layer 140. The reflection forming layer 220 and the pixel definition layer 230 may include substantially the same material as each other, and the pixel definition layer 230 may be disposed between adjacent color filters 130.

The organic light emitting member 250 is disposed on the anode 210, and the cathode 260 is disposed on the organic light emitting member 250, the reflection forming layer 220 and the pixel definition layer 230.

As described above, by the recess portion 31 in the light path control layer 40 at the lower surface of the blue color filter 130B and the convex portion 32 in the light path control layer 40 at the lower surface of the green color filter 130G or the red color filter 130R, the light path P1B at the side of the blue pixel is substantially the same as the light path P2B at the front and the light path P1R at the side of the green pixel or the red pixel is longer than the light path P2R in the front such that the luminance at the side of the blue pixel is improved and the luminance of the side of the green pixel or the red pixel may be maintained or reduced.

Accordingly, in such an embodiment, the color twist defect of the side by the side luminance reduction in the blue pixel, which may occur in a conventional white OLED display, may be substantially improved such that a luminance distribution characteristic in each pixel at the side may be maintained substantially similar to a luminance distribution characteristic in each pixel at the front.

While the invention has been described in connection with what is presently considered to be practical exemplary embodiments, it is to be understood that the invention is not limited to the disclosed embodiments, but, to on the contrary, is intended to cover various modifications and equivalent arrangements included within the spirit and scope of the appended claims.

What is claimed is:

1. An organic light emitting diode display comprising:
    a substrate;
    a driving wire disposed on the substrate;
    a color filter on the driving wire, wherein the color filter comprises a blue color filter, a red color filter and a green color filter;
    an organic light emitting diode disposed on the color filter;
    a light path control layer disposed between the driving wire and the color filter,
    wherein only one recess portion is defined in the light path control layer at a lower surface of the blue color filter, the only one recess portion recessing toward an upper surface of the substrate from an upper surface of the light path control layer, and
    only one convex portion is defined in the light path control layer at a lower surface of the red color filter or the green color filter, the only one convex portion being convex upward with respect to the upper surface of the substrate.

2. The organic light emitting diode display of claim 1, further comprising:
    a cover layer disposed on the color filter and which covers the color filter.

3. The organic light emitting diode display of claim 2, wherein
    the organic light emitting diode comprises:
        an anode disposed on the cover layer;
        an organic light emitting member disposed on the anode; and
        a cathode disposed on the organic light emitting member.

4. The organic light emitting diode display of claim 3, further comprising:
    a reflection forming layer disposed on the cover layer and which covers an edge of the anode, and
    a pixel definition layer disposed on the cover layer and between adjacent color filters of the blue color filter, the red color filter and the green color filter.

5. The organic light emitting diode display of claim 4, wherein
    the driving wire comprises a switching thin film transistor and a driving thin film transistor.

6. The organic light emitting diode display of claim 5, wherein
    the reflection forming layer and the pixel definition layer comprise substantially the same material as each other.

7. The organic light emitting diode display of claim 6, wherein
    the reflection forming layer and the pixel definition layer are separated from each other.

8. The organic light emitting diode display of claim 1, wherein the organic light emitting diode disposed on the color filter includes an organic light emitting member which emits a same color light to the blue color filter, the red color filter and the green color filter.

9. The organic light emitting diode display of claim 8, wherein the organic light emitting member includes a white organic emission layer to emit light having a white color.

10. The organic light emitting diode display of claim 8, wherein the organic light emitting diode includes an organic light emitting diode disposed on each of the color filters, the organic light emitting diode on each of the color filters including an anode, the organic light emitting member which includes an organic emission layer on the anode to emit white light to the blue color filter, the red color filter and the green color filter, and a cathode covering the organic light emitting member.

11. The organic light emitting diode display of claim 1, wherein the lower surface defining the red color filter or the green color filter has a different shape of the lower surface defining the blue color filter.

\* \* \* \* \*